United States Patent
Kaneko

(10) Patent No.: US 6,873,753 B2
(45) Date of Patent: Mar. 29, 2005

(54) COLUMNAR OPTICAL DEVICE AND METHOD FOR MANUFACTURING THE SAME

(75) Inventor: Yasuhisa Kaneko, Kanagawa (JP)

(73) Assignee: Agilent Technologies, Inc., Palo Alto, CA (US)

(*) Notice: Subject to any disclaimer, the term of this patent is extended or adjusted under 35 U.S.C. 154(b) by 36 days.

(21) Appl. No.: 10/219,968

(22) Filed: Aug. 14, 2002

(65) Prior Publication Data

US 2003/0044103 A1 Mar. 6, 2003

(30) Foreign Application Priority Data

Aug. 28, 2001 (JP) ........................................ 2001-258633

(51) Int. Cl.⁷ .......................... G02B 6/12; C03B 37/018
(52) U.S. Cl. ............................... 385/14; 385/15; 65/421
(58) Field of Search ............................ 385/24, 55, 102, 385/137, 37, 7, 15, 33, 49; 438/22, 27, 29, 31, 42, 32; 272/7, 43, 48, 64, 75; 372/7, 6; 65/377, 393, 385, 414, 409, 421, 411

(56) References Cited

U.S. PATENT DOCUMENTS

| | | | | |
|---|---|---|---|---|
| 4,708,726 A | * | 11/1987 | Miller et al. | 65/421 |
| 4,734,117 A | * | 3/1988 | Pilon et al. | 65/397 |
| 5,281,248 A | * | 1/1994 | Barish et al. | 65/421 |
| 5,397,372 A | * | 3/1995 | Partus et al. | 65/421 |
| 5,942,296 A | * | 8/1999 | Oh et al. | 428/34.6 |
| 6,131,415 A | * | 10/2000 | Chang et al. | 65/391 |
| 6,215,092 B1 | * | 4/2001 | Goudeau et al. | 65/391 |
| 6,408,653 B1 | * | 6/2002 | Oh et al. | 65/419 |
| 6,459,834 B1 | * | 10/2002 | Kim et al. | 385/37 |
| 2002/0102083 A1 | * | 8/2002 | Berkey et al. | 385/123 |
| 2004/0069019 A1 | * | 4/2004 | Carter et al. | 65/421 |
| 2004/0144134 A1 | * | 7/2004 | McDonald et al. | 65/421 |
| 2004/0237595 A1 | * | 12/2004 | Fogliani et al. | 65/421 |
| 2004/0244426 A1 | * | 12/2004 | Park et al. | 65/421 |

OTHER PUBLICATIONS

Fiber Optics Handbook—chapter 1,5– p. 32–35, Frederick C. Allard.
"Low–Crosstalk 10–GHz–Spaced 512–Channel Arrayed–Waveguide Grating Multi/Demultiplexer Fabricated on a 4–in Wafer"—Takada, et al. IEEE Photon Tech. Lett. 13(2001) 1182.
"Dispersion Slope Equaliser using Bend–Induced Positive Disperison Slope in Coiled Pure–Silica Fibre"—Kato, et al.—Electron.Lett. 37 (2001) 680.
"Optical Fiber Amplifier Module"—Suzuki—The Institute of Electronics, Information and Communication Engineers, vol. 74, No. 3 pp 221–224, Mar. 1991.
PCT International Publication No. WO/98/25090—"Spherical Shaped Semiconductor Integrated Circuit".

* cited by examiner

Primary Examiner—Brian Healy
Assistant Examiner—James P. Hughes

(57) ABSTRACT

An optical device having an optical circuit integrated on a side of a substrate having a column of substrate material. The column of substrate material preferably includes a cylindrical portion having a circular cross-section. The optical device preferably includes an optical waveguide that is wound around the cylindrical portion of the substrate. The waveguide is defined by a core region in a layer of optically transparent material on the side of the column. The core region can be generated by altering the index of refraction of the transparent material. The core region can also be generated by depositing a patterned layer of a second optically transparent material. The optical device can also include active devices such as fiber amplifiers, semiconductor lasers, and optical sampling devices. The optical device is preferably constructed by rotating the substrate while depositing optically transparent materials and/or various semiconductor materials on the substrate.

6 Claims, 17 Drawing Sheets

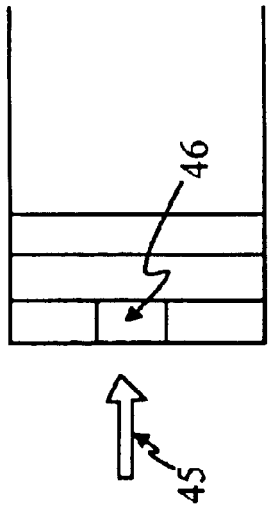
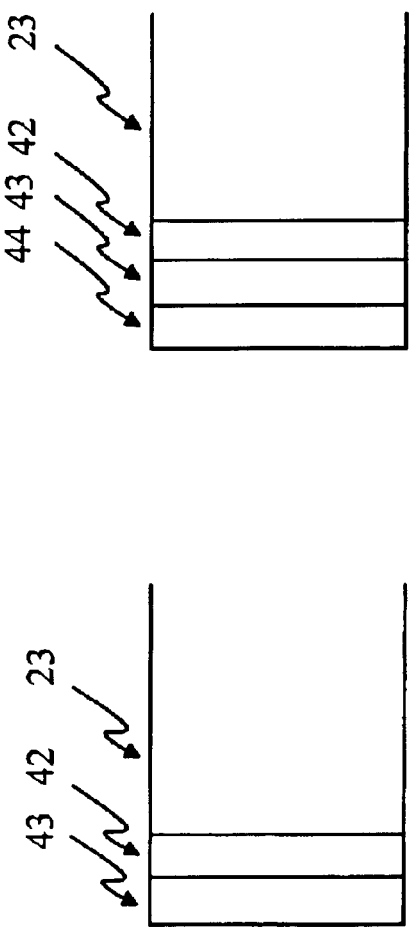
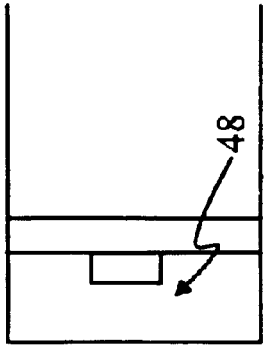
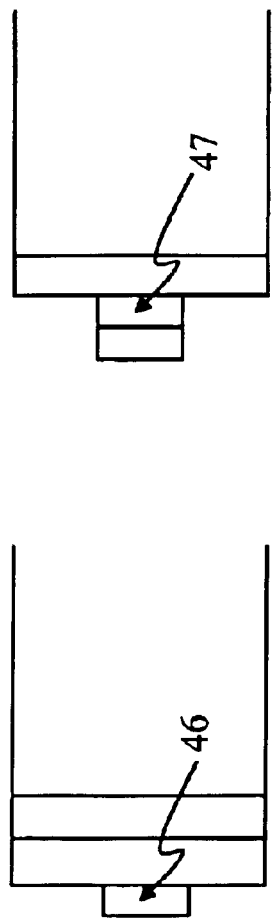
FIGURE 4

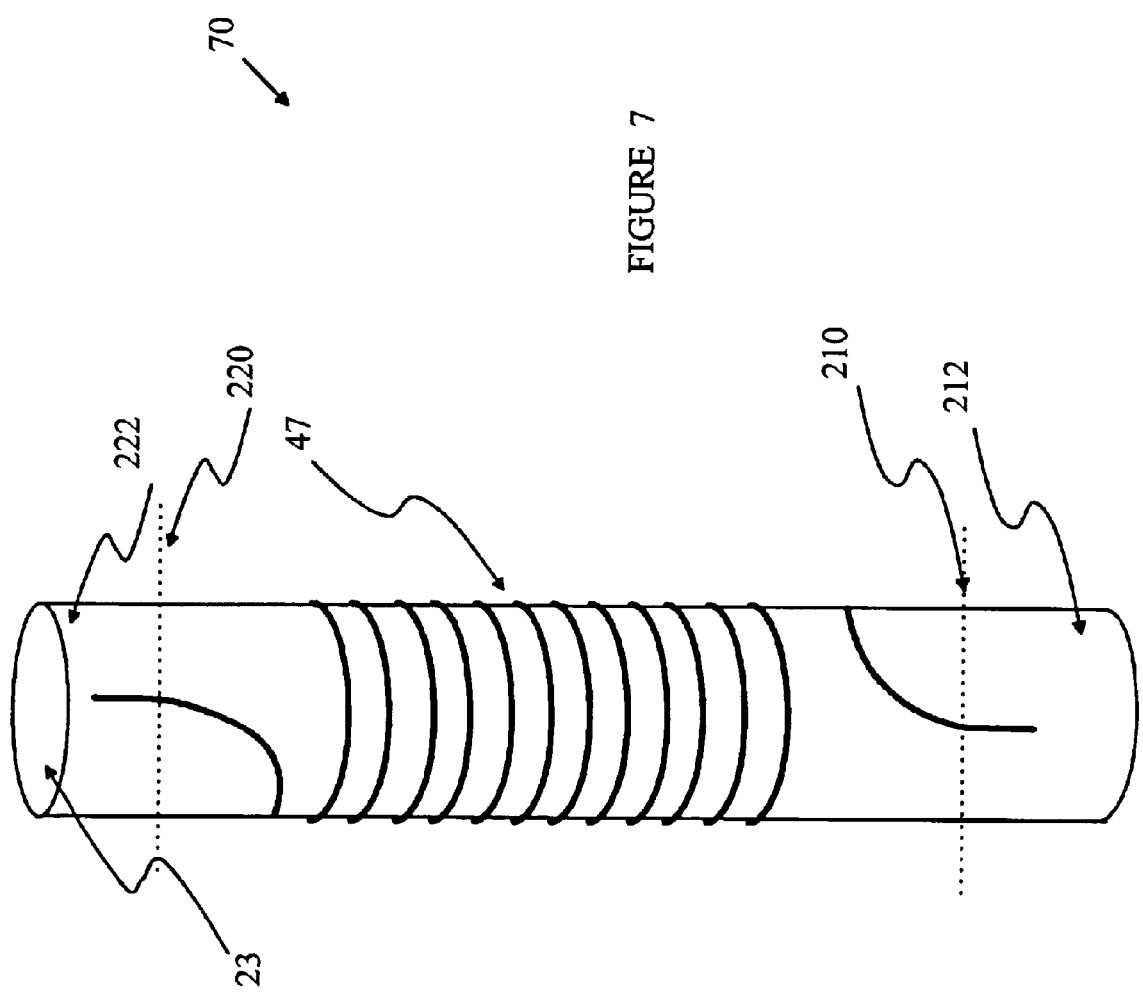

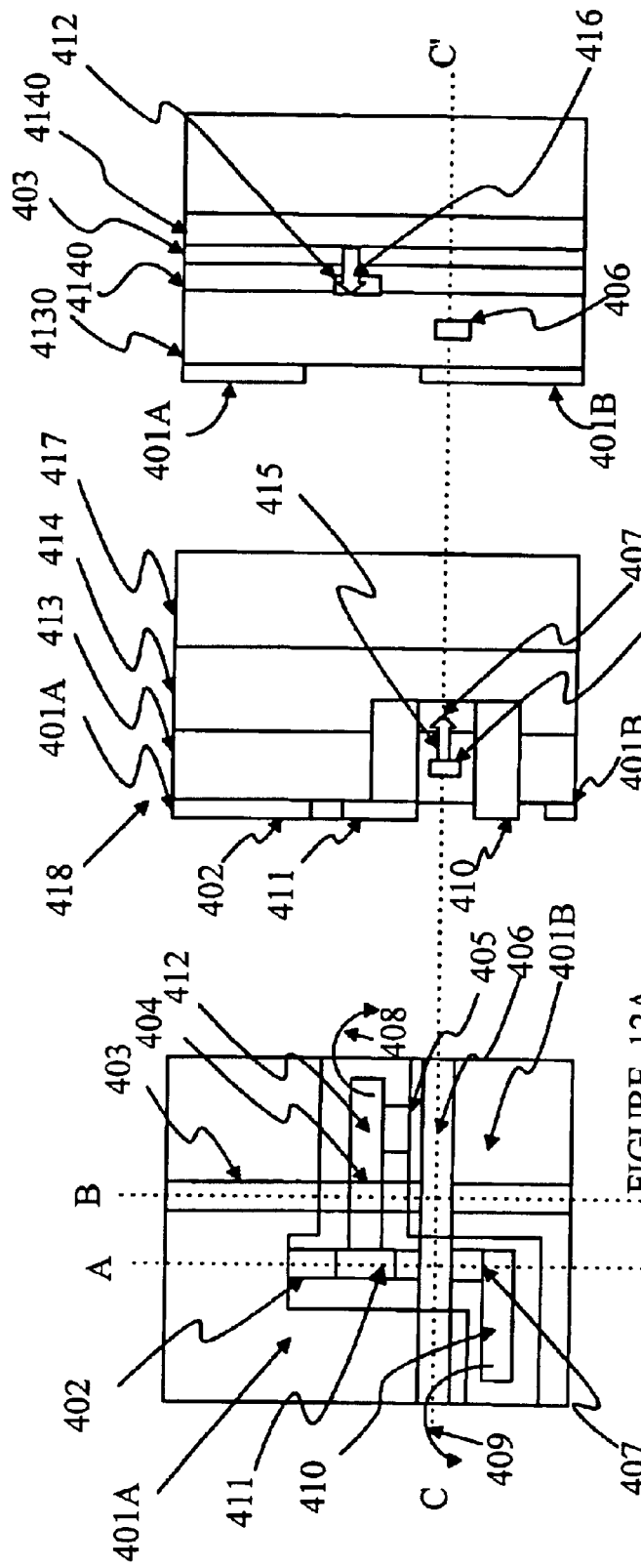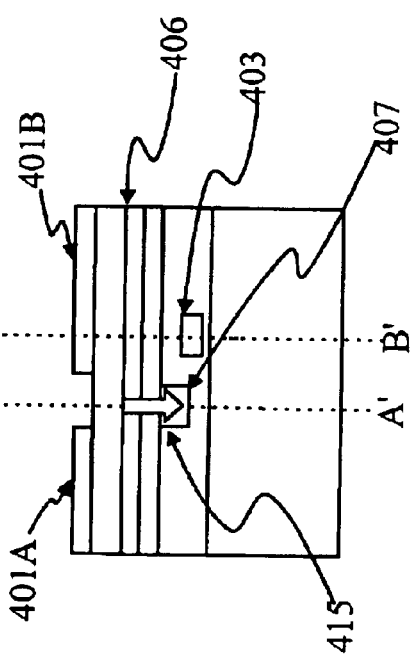

US 6,873,753 B2

COLUMNAR OPTICAL DEVICE AND METHOD FOR MANUFACTURING THE SAME

FIELD OF THE INVENTION

The present invention relates to optical devices, and more particularly, to optical devices formed on the sides of a three-dimensional substrate.

BACKGROUND OF THE INVENTION

Modern communication systems require ever increasing bandwidths. To provide the required bandwidths, optical communication technology that makes use of optical fibers has become essential. The devices required by an optical network include not only optical fibers, but also lasers for converting electrical signals into optical signals, light amplifiers, light attenuators, and numerous other electronic and optoelectronic devices.

Optical fibers provide the waveguide function in most optical networks. Hence, imparting other network functions to optical fibers is highly desirable. Devices such as amplifiers, filters, and optical delay lines have all been implemented in optical fibers. In the following discussion, optoelectronic devices that utilize optical fibers for functions in addition to the waveguide function will be referred to as "functional optical fibers."

To accommodate the length of optical fiber in an optoelectronic device having a functional optical fiber, the optical fibers are wound around a cylindrical or spool-shaped base. The material that makes up a conventional functional optical fiber has poor mechanical strength. In addition, bending or twisting of a functional optical fiber can create non-uniform stress in the optical fiber, which produces birefringence. The birefringence often causes a change in the direction of polarization or to transmission losses. Accordingly, the fiber usually cannot be bent to a radius of curvature of less than about 20 cm in conventional functional optical fibers. This results in greater bulk and increased cost.

For the purposes of this discussion, the term "optoelectronic circuit" is used to refer to a circuit that may include both an electronic circuit and an optical circuit. An optical circuit means a device that includes a path for conveying an optical signal between two points that are separated in space. An "optoelectronic device" refers to any device that includes an optoelectronic circuit.

Broadly, it is the object of the present invention to provide an improved optoelectronic device.

This and other objects of the present invention will become apparent from the following detailed description of the preferred embodiments of the present invention and the accompanying drawings.

SUMMARY OF THE INVENTION

The present invention is an optical device having an optical circuit integrated on a side of a substrate having a column of substrate material. The column of substrate material preferably includes a cylindrical portion having a circular cross-section. The optical device preferably includes an optical waveguide that is wound around the cylindrical portion of the substrate. The waveguide is defined by a core region in a layer of optically transparent material on the side of the column. The core region can be generated by altering the index of refraction of the transparent material. The core region can also be generated by depositing a patterned layer of a second optically transparent material. The optical device can also include active devices such as fiber amplifiers, semiconductor lasers, and optical sampling devices. The optical device is preferably constructed by rotating the substrate while depositing optically transparent materials and/or various semiconductor materials on the substrate. The substrate is preferably rotated about the cylindrical axis.

BRIEF DESCRIPTION OF THE DRAWINGS

FIGS. 4A–4F are cross-sectional views of a portion of the surface of optical apparatus 20 at various stages in the fabrication process.

FIG. 7 is a perspective view of the cylindrical work piece after the deposition of the upper cladding layer.

FIGS. 11, 12A–12D, 13 and 14 illustrate the manner in which a sampling apparatus 300 is constructed according to the present invention.

FIG. 11 illustrates the substrate and the optical waveguides of sampling apparatus 300, in practice, an electrical circuit pattern is disposed over these.

FIGS. 12A–12D are detail enlargements of the area 336 shown in FIG. 11.

FIG. 13 is an optoelectric equivalent circuit diagram.

FIG. 14 illustrates the relationship between sampling light and the signal light that is sampled by the apparatus.

DETAILED DESCRIPTION OF THE PREFERRED EMBODIMENTS

Figure 1:
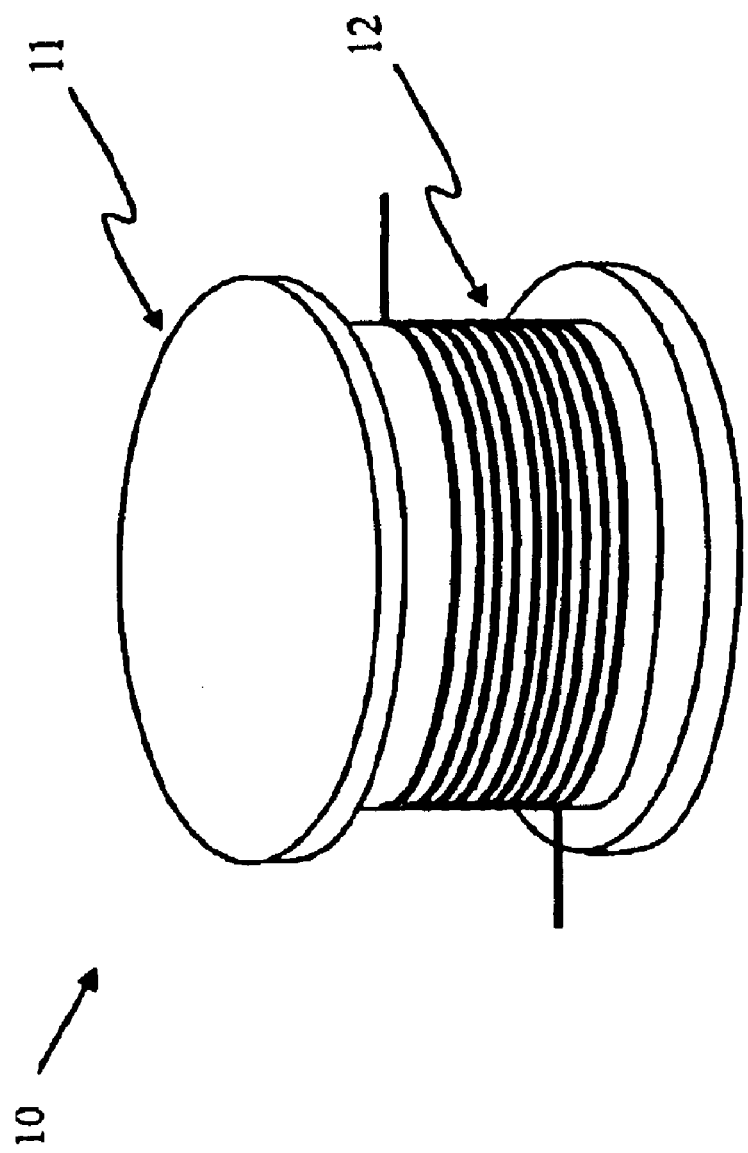
FIG. 1 is a perspective view of a prior art optical device 10.

The manner in which the present invention provides its advantages can be more easily understood with reference to FIG. 1, which is a perspective view of a prior art optical device 10. Optical device 10 includes a waveguide that is formed by winding an optical fiber 12 around a spool 11. As noted above, the diameter of the spool needs to be relatively large because of the poor mechanical strength of the optical fiber. In addition, the tension with which the fiber is wound around the spool must be maintained uniform to prevent non-uniform stresses in the fiber.

The present invention avoids these limitations by fabricating the waveguide in layers on the surface of a cylindrical substrate. Such a waveguide avoids the problems that result from bending a preformed optical fiber around a cylindrical substrate. In the preferred embodiment of the present invention, the cylindrical substrate has a circular cross-section. However, the present invention may be practiced on other substrate shapes.

Figure 2B:
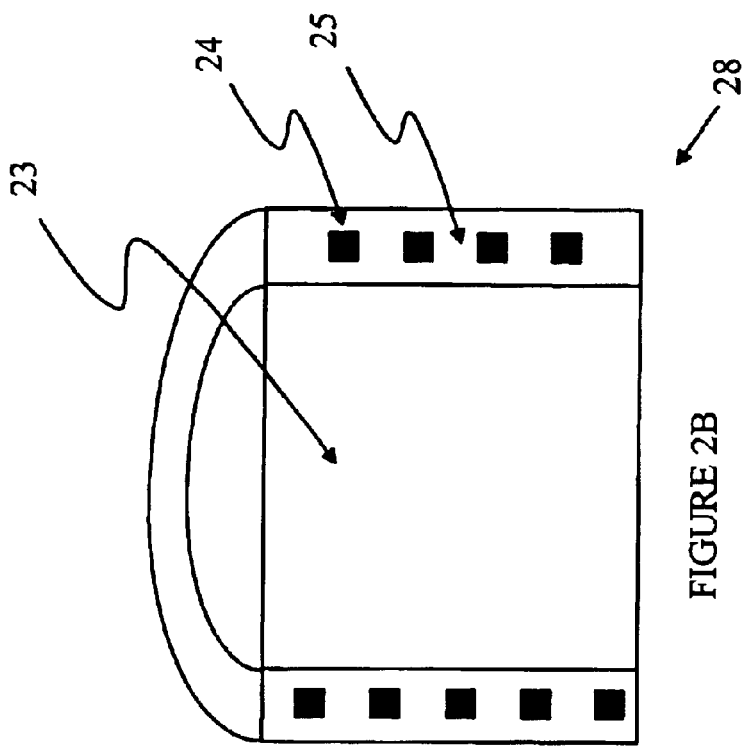
FIG. 2B is a partial enlargement of a cross sectional view of optical apparatus 20 in a plane that passes through the axis 29 of the cylindrical substrate.
Figure 2A:
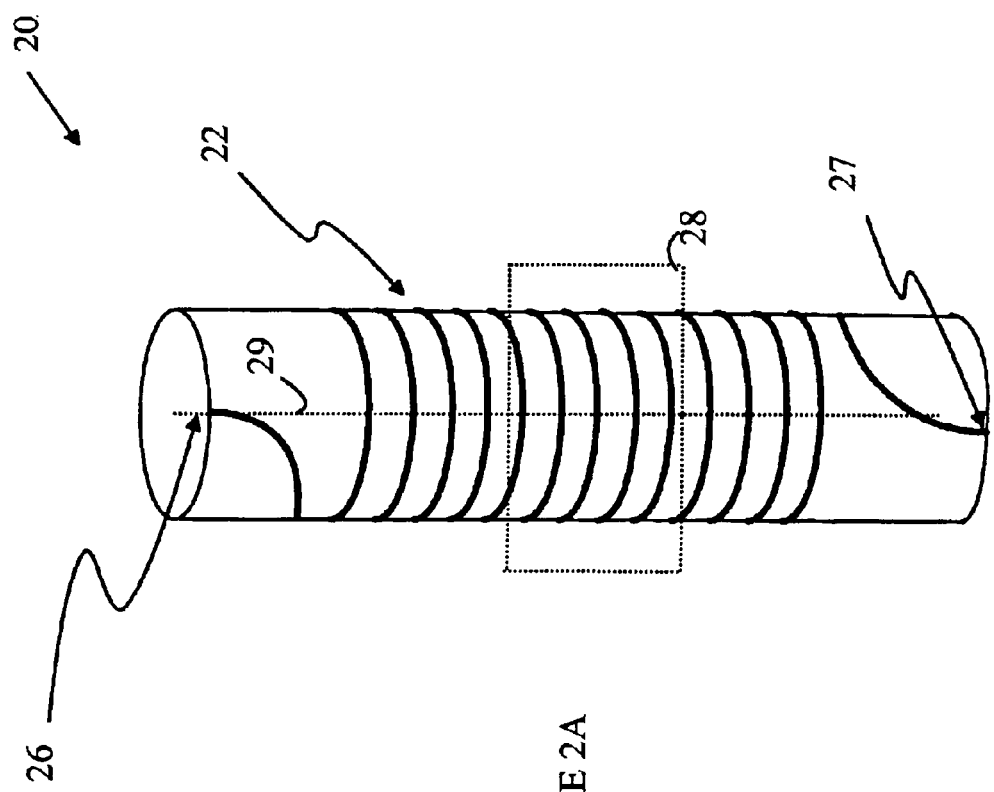
FIG. 2A is a perspective view an optical apparatus 20 according to one embodiment of the present invention.

Refer now to FIGS. 2A and 2B. FIG. 2A is a perspective view of an optical apparatus 20 according to one embodiment of the present invention that can be used as part of an optoelectronic device. FIG. 2B is a partial enlargement of a cross sectional view of optical apparatus 20 in a plane that passes through the axis 29 of the cylindrical substrate in the region indicated at 28. Optical apparatus 20 may be viewed as comprising an optical waveguide layer 22 having an optical core 24 in a cladding layer 25. The cladding layer is constructed on a substrate 23, which is columnar in shape. While various shapes are possible, circular cylindrical is preferred. The following description assumes a circular cylindrical shape is utilized. Optical apparatus 20 also includes input and output terminals or ports shown at 26 and 27.

The optical waveguide layer 22 composed of cladding layer 25 and core 24 is disposed on the sides of the support substrate 23. The core 24 is embedded in the cladding layer 25, and winds in a spiral around the support substrate 23. Adjacent loops of the waveguide have a constant pitch and are separated by a specific distance in the columnar axis direction of support substrate 23. The refractive index of core 24 is set higher than that of the cladding layer 25, so that the light will be trapped within the core 24.

Light moving in the columnar axis direction through the waveguide layer 22 mainly propagates through the core 24. The optical waveguide consists substantially of the core 24 and the outer surroundings thereof. Leakage light between adjacent optical waveguide loops can be ignored if the loops are spaced sufficiently far apart. In general, conventional optical waveguides do not allow light to propagate over a wide space, and transmit light trapped within a narrow cross section with a diameter of about 1 mm or less. The present invention utilizes similar dimensions to assure that the optical waveguide constructed on the columnar substrate of the present invention performs in a similar manner. However, if needed, an opaque barrier layer may be utilized to further reduce leakage between adjacent loops of the core 24.

Light input and output terminals 26 and 27 provide interface connections from the top and bottom of the support substrate 23. Light input and output terminals 26 and 27 are structured for accessibility and mechanical strength. The ends of the core are designed to be perpendicular to the end faces at the top and bottom of the support substrate 23 at the light input and output terminals 26 and 27. FIG. 2A shows an example in which these end faces are at a right angle to the direction of the columnar axis of support substrate 23. This is favorable in terms of having the external optical fibers extend in the columnar axis direction of the support substrate 23 in the vicinity of the light input and output terminals 26 and 27.

Support substrate 23 can be formed in any size desired, since the size constraints of conventional wound optical waveguides do not apply to the present invention. Since compactness is advantageous, the preferred embodiment of the present invention utilizes a support structure having a diameter of 1 cm and a length of 5 cm, or less. As noted above, if the core 24 is wound in a spiral, adjacent loops of the core must be spaced far enough apart to prevent light leakage. Conventional optical fibers typically have a core diameter of 8 $\mu$m and a cladding diameter of 125 $\mu$m. Accordingly, the preferred embodiment of the present invention uses these sizes to assure that the performance of an optoelectronic device according to the present invention is at least as good as a conventional optical fiber. If these dimensions are utilized, a core with a length of about 10 meters can be provided on the compact substrate discussed above. The gap between loops of the core can be further narrowed by proper selection of the structure of the waveguide layer 22 to increase the trapping of light in core 24, thereby affording a greater overall length for the core.

Embodiments of the present invention in which support substrate 23 is in the form of a tube or partial tube may also be practiced. As long as the electrical performance, mechanical strength, and ease of handling of the optoelectronic apparatus are not compromised, the substrate can have an arbitrary shape.

The materials used for prior art optical fibers and optical waveguides can also be employed for the corresponding core, cladding layer, and support substrate of the present invention. For example, core 24, cladding layer 25, and support substrate 23 may be made from a material whose main component is $SiO_2$. The index of refraction of the $SiO_2$ can be varied by adding boron (B), germanium (Ge), or similar doping materials.

It should be noted that the basic waveguide structure discussed above could be utilized to construct any type of optical element currently provided on flat substrates, such as photocouplers, interferometers, attenuators, lenses, and filters. In addition, fiber amplifiers can be formed by adding erbium or another rare earth element to the core. Fiber gratings can also be formed by creating a periodic refractive index distribution in the propagation direction of the core.

Optical apparatus 20 is preferably fabricated on an apparatus that is analogous to a lathe. The fabrication apparatus includes a chuck mechanism to engage the substrate such that the substrate can be rotated about axis 29 that passes through the center of the cross-sections of the cylindrical column of material. Various processing devices can be moved in a direction parallel to the axis such that the processing device can access any position on the surface of the substrate.

Figure 3:
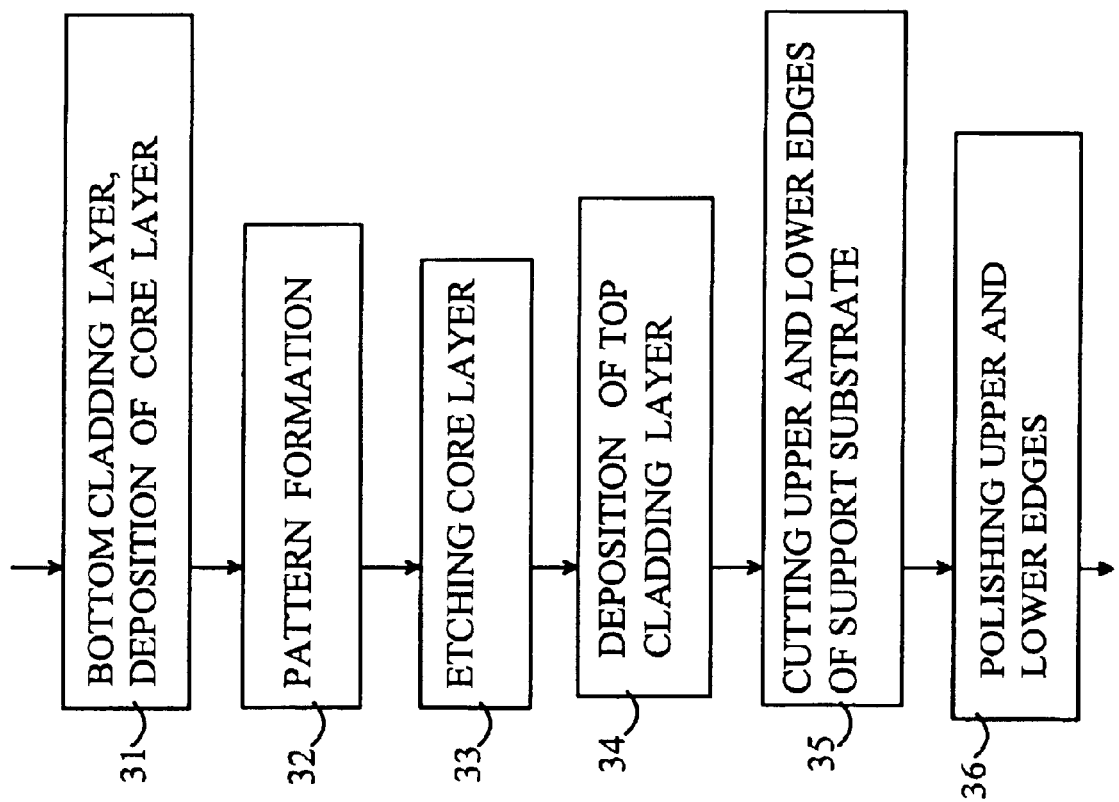
FIG. 3 is a flow chart of the fabrication method.
Figure 5A:
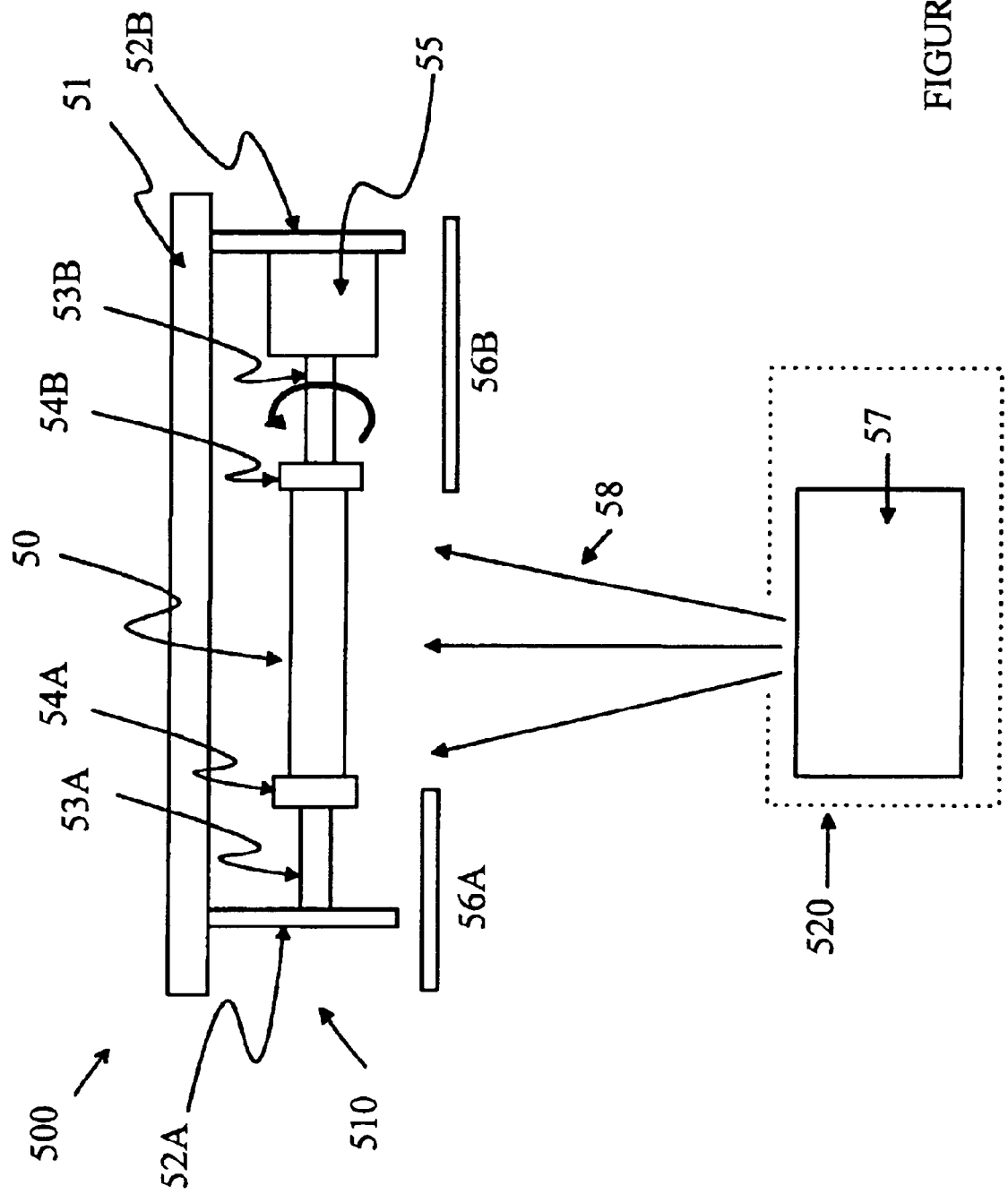
FIGS. 5A and 5B are schematic drawings of a film forming apparatus for use in depositing films on the surface of the substrate.
Figure 5B:
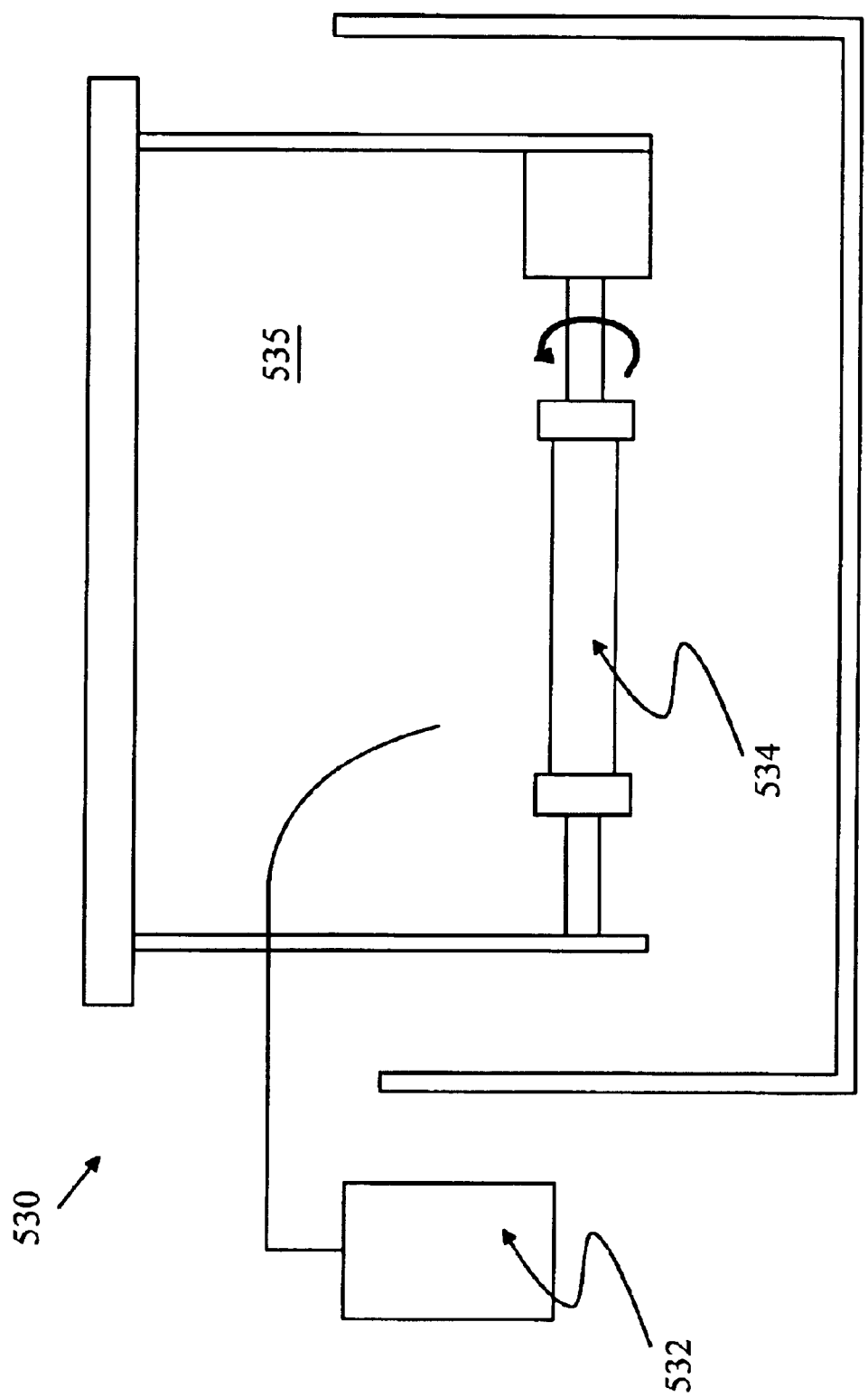
Figure 6A:
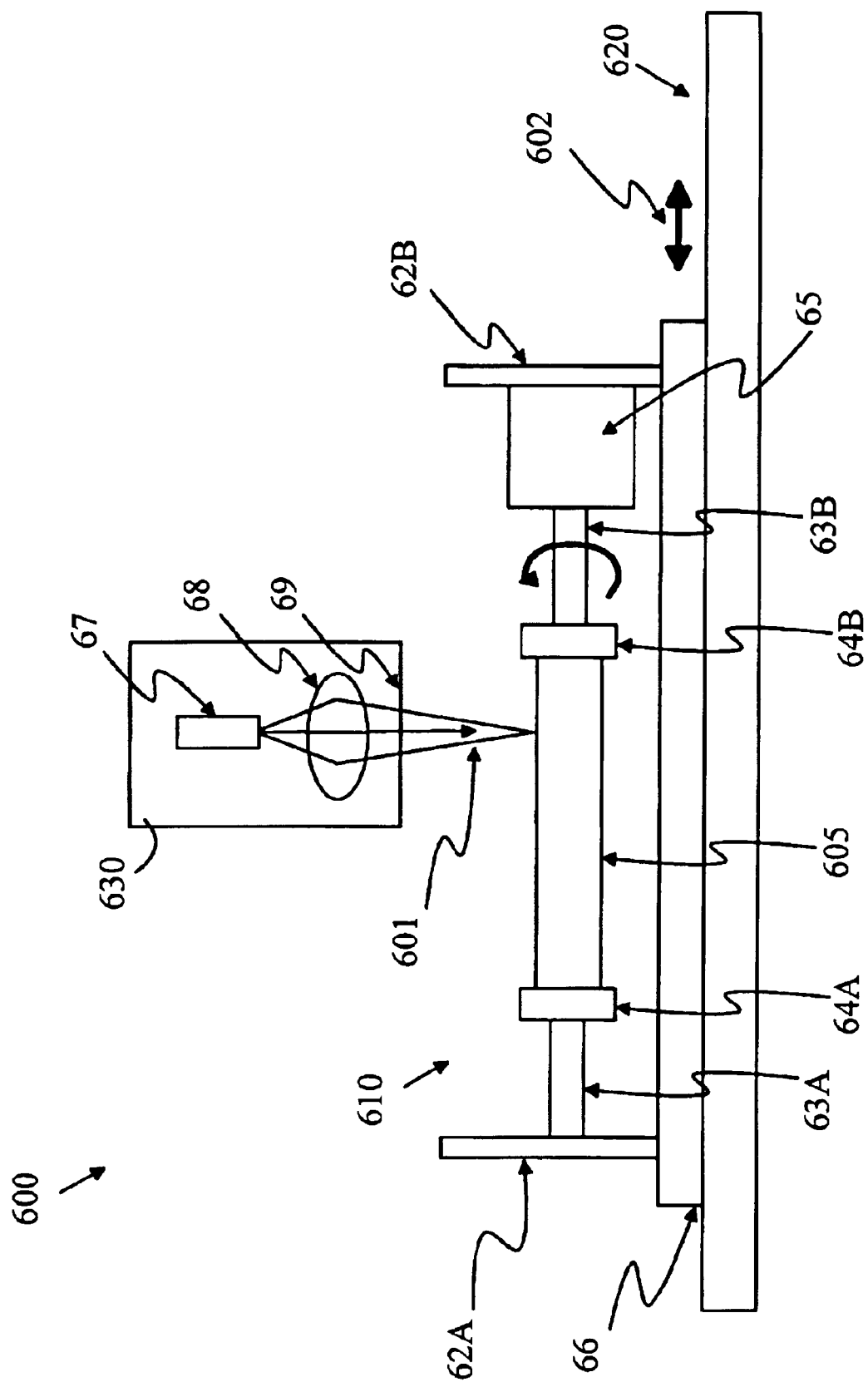
FIGS. 6A and 6B are schematic drawings of a writing device for use in the fabrication of the substrate.
Figure 6B:
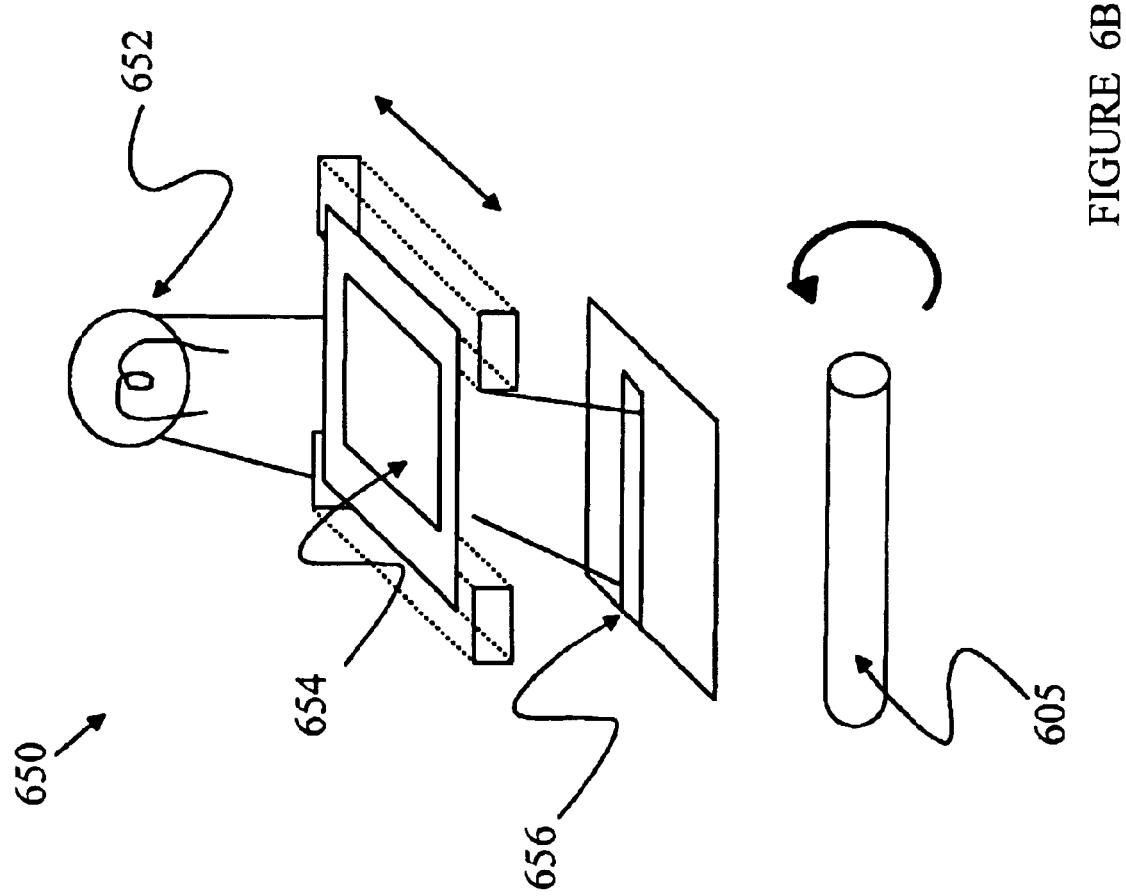
Figure 6C:
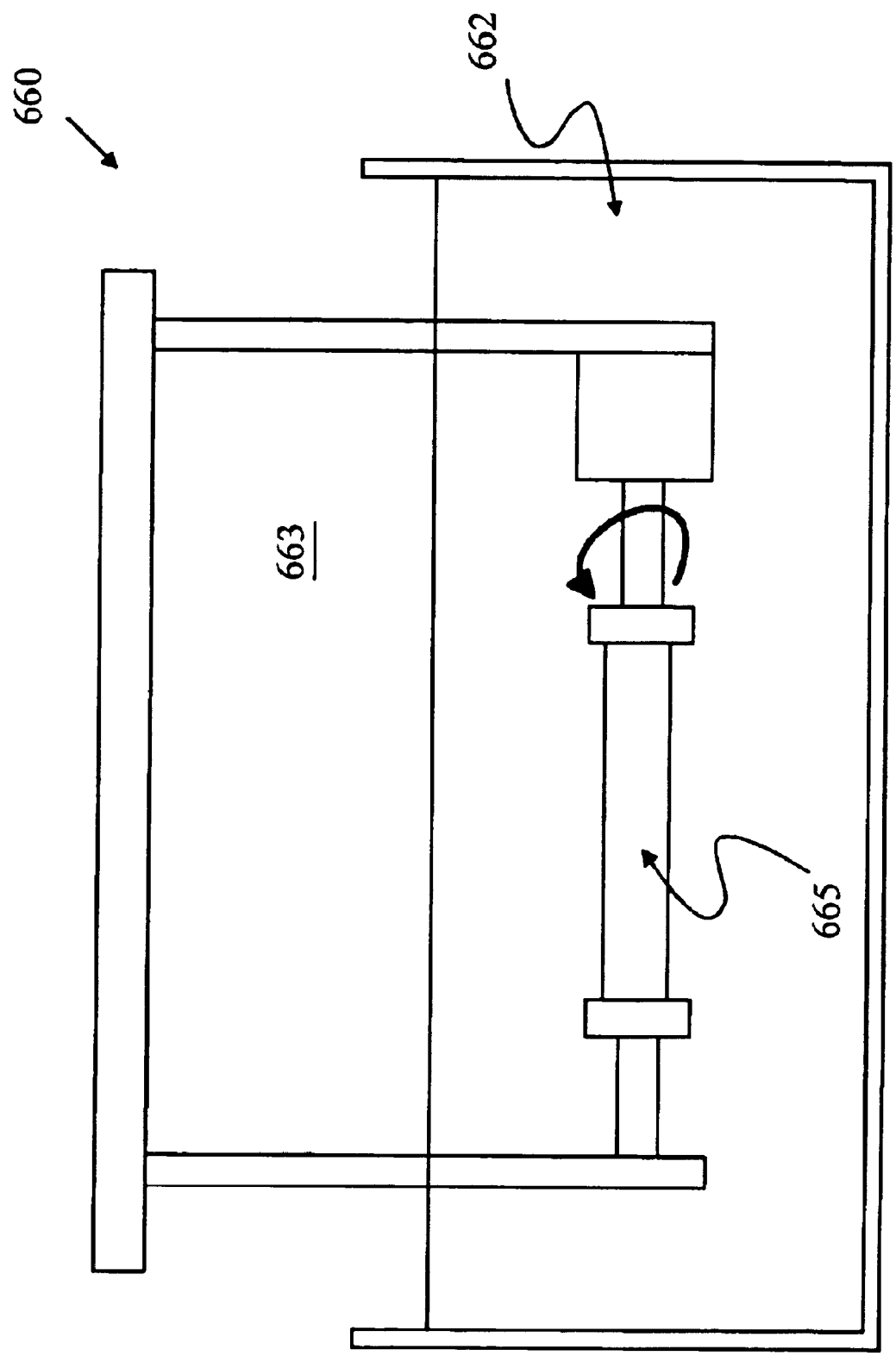
FIG. 6C is a schematic drawing of a device for developing photoresists and etching the surface of the optoelectronic 20 at various stages in the fabrication thereof.

The manner in which optical apparatus 20 is fabricated will now be discussed in more detail with reference to FIGS. 3–7. FIG. 3 is a flow chart of the fabrication method. FIGS. 4A–4F are cross-sectional views of a portion of the surface of optical apparatus 20 at various stages in the fabrication process. FIGS. 5A and 5B are schematic drawings of a film forming apparatus for use in depositing films on the surface of the substrate. FIGS. 6A and 6B are schematic drawings of a writing device for use in the fabrication of the substrate. FIG. 6C is a schematic drawing of a device for developing photoresists and etching the surface of the optoelectronic 20 at various stages in the fabrication thereof.

The fabrication process starts by depositing the bottom cladding layer as shown at 31. In this step, the two ends of a cylindrical work piece 50 (preferably $SiO_2$) are attached to the film forming apparatus 500 via attachment jigs 54A and 54B. As shown in FIG. 5A, the film forming apparatus 500 is divided into two main parts: a rotation mechanism 510 and a film formation mechanism 520. Film formation mechanism 520 is a conventional apparatus, and preferably forms a film from a film formation material supplied from a material source 57 by vapor deposition or sputtering on the sides of the cylindrical work piece 50. $SiO_2$ is the preferred film formation material for the upper cladding layer, while $GeO_2$-doped $SiO_2$ is preferable for the core 24. The $GeO_2$ doping amount is preferably be 8%/mol.

If $SiO_2$ is used to form the upper cladding layer 48, the film formation material will be the material from which cylindrical work piece 50 is constructed, and hence, the film formation step used to construct lower cladding layer 42 can be omitted. In general, when the refractive index of the cladding layer is the same as the refractive index near the surface of the cylindrical work piece 50 (which becomes the optical waveguide portion), the film formation step for the lower cladding layer 42 can be omitted.

The rotation mechanism 510 is designed such that a rotary motor 55 and one rotary connecting rod 53A are supported by rotor support plates 52A and 52B fixed on a rotation mechanism support plate 51. The rotor support plate 52A rotatably supports the rotary connecting rod 53A. The other rotary connecting rod 53B is fixed to the rotary shaft of the rotary motor 55, so that the rotary shaft rotates integrally with the cylindrical work piece 50. The ends of the cylindrical work piece 50 are fixed to the rotary connecting rods 53A and 53B via the attachment jigs 54A and 54B, respectively, so that the cylindrical work piece 50 rotates at a specific speed around its columnar axis.

While cylindrical work piece 50 is rotating as indicated by the arrow of rotary connecting rod 53B, the sides of cylindrical work piece 50 are coated by film formation material emission beam 58, and a tubular film is formed on the exposed portion of cylindrical work piece 50. The preferred rotational speed is 10 to 100 rpm. The rotation of cylindrical work piece 50 causes the film formation material to be distributed in a uniform thickness around the sides of cylindrical work piece 50. Opening and closing an irradiation aperture with shielding plates 56A and 56B controls the irradiation of cylindrical work piece 50 with the film formation material. When a film is formed by sputtering, film formation mechanism 520 can be located at the top of the rotation mechanism 510.

The state of the side surface of cylindrical work piece 50 in step 31 is shown in FIG. 4A. At the start of step 31, the sides of the support substrate 23 are cleaned at the same time they are subjected to film formation with an ordinary film formation apparatus. Next, while the cylindrical work piece 50 is rotated, the film formation material ($SiO_2$, $GeO_2$-doped $SiO_2$, etc.) from film formation material source 57 is applied to form first a lower cladding layer 42, and then a core layer 43 on the sides of the support substrate 23.

Any conventional film formation process can be utilized. For example, film formation processes based on vapor deposition, sputtering, chemical vapor deposition, or spin coating, can be used.

After the core layer 43 has been formed, a resist coating is applied as shown at 32. The resist coating is preferably applied by resist coating apparatus 530 shown in FIG. 5B. The resist coating apparatus operates on the cylindrical work piece that now includes cladding layer 42 and core layer 43. This modified work piece is shown at 534. Work piece 534 is attached to a rotation mechanism 535 that is similar to rotation mechanism 510, and rotated as indicated by the arrow in the drawing. The resist material used in this working example is preferably a photosensitive resist such as AZ6124 from Hoechst. The sides of cylindrical work piece 534 are coated with the resist contained in a resist tank 532. The cylindrical work piece 534 is rotated at a speed of several thousand rpm to form a resist layer 44 in the desired uniform thickness (about 3 $\mu$m) as shown in FIG. 4B. The resist coating is then baked for a specific time to cure the coating.

After the resist has been cured, region 46 is irradiated by exposure to beam 45 to form a spiral pattern that defines the core of the optical waveguide as shown in FIG. 4C. A suitable writing apparatus for irradiating the resist layer is shown in FIG. 6A at 600. The structure of writing device 600 is similar to that of film forming apparatus 500 in that it includes a rotational apparatus 610 for rotating the work piece and a translational movement apparatus 620 for moving the work piece in a direction parallel to the axis of the work piece. An exposure apparatus 630 generates the light beam for the exposure. Exposure apparatus 630 is preferably a laser that emits light at the appropriate frequency to expose the resist material. Since such sources are conventional in the art, they will not be discussed further here.

Cylindrical work piece 605, which is the cylindrical work piece 50 after undergoing film formation and resist coating, is attached at its ends to attachment jigs 64A and 64B that are fixed to the rotary connecting rods 63A and 63B, respectively, of rotation mechanism 610. Rotation mechanism 610 is attached so as to be movable with respect to exposure apparatus 630 by translational movement apparatus 620, which causes the work piece to move relative to rotational mechanism 610 in the directions shown by arrows 602.

In the embodiment depicted in FIG. 6A, exposure apparatus 630 includes an exposure light source 67 and a converging lens 68 that is installed on an exposure component support base 69. The light generated from the exposure light source 67 is formed into a converged beam 601 by lens 68. While this example utilizes a positive resist, a negative resist can also be utilized. In that case, everything but the pattern region 46 of the resist layer 44 is irradiated with the converged beam 601 of laser light.

A rotary motor 65 and one rotary connecting rod 63A are supported by rotor support plates 62A and 62B fixed on movable stage 66. Rotor support plate 62A rotably supports one rotary connecting rod 63A. The other rotary connecting rod 63B is fixed to the rotary shaft of motor 65, so that the shaft rotates integrally with the cylindrical work piece 50. The ends of the cylindrical work piece 50 are fixed to the rotary connecting rods 63A and 63B via attachment jigs 64A and 64B, respectively, so that the cylindrical work piece 50 rotates at a specific speed around its columnar axis.

It should be noted that any specified pattern can be formed on the resist layer 44 by selectively turning beam 601 on and off while controlling the rotation of the work piece and the movement of movable stage 66. In addition, the light spot shape and size and the emission direction of the converged beam 601 on the resist layer 44 can also be controlled. In this respect, it is advantageous to provide a fiduciary pattern for defining specific points on the surface of the work piece that can be used to position the work piece in subsequent steps.

A second embodiment of a writing apparatus for use in constructing an optoelectronic apparatus according to the present invention is shown in FIG. 6B at 650. Writing device 650 utilizes a photomask 654 that is irradiated with UV light from a UV light source 652 while the photomask is moved perpendicular to the direction of the columnar axis. Cylindrical work piece 605 is rotated around its columnar axis by a rotation mechanism that is similar to rotational apparatus 610 discussed above. The cylindrical work piece 605 is irradiated in a pattern determined by the photomask and a slit 656. The movement of cylindrical work piece 605 and photomask 654 is synchronously controlled so that the desired pattern will be formed.

After exposure, the resist layer is developed to remove the resist layer everywhere except in the pattern region 46 as shown in FIG. 4D. Developing can be performed by filling the developing and etching apparatus 660 shown in FIG. 6C with developing solution 662, and immersing the exposed cylindrical work piece 665 in this developing solution 662 in the conventional manner. Cylindrical work piece 665, which is cylindrical work piece 50 after undergoing everything up to and including exposure, may be attached to a rotation mechanism 663 that is the same as the rotation mechanism 510, and rotated as indicated by the arrow to facilitate the development process.

After the surface of the core layer has been masked, the core layer is etched to form the core of the optical waveguide as shown at 33 in FIG. 3. Any suitable etching method can be utilized. For example, an acid solution or a plasma can be used for this etching. After etching, the resist is removed. The surface of the optoelectronic apparatus after the etching operation is shown in FIG. 4E. The etching operation leaves the core 47 under the masking layer.

If an acid etch is utilized, the etching step can be performed by the apparatus shown in FIG. 6C, using an acid solution instead of the developing solution 662. When plasma etching is performed, the apparatus shown in FIG. 5A can be used by replacing film formation material emission beam 58 by a plasma beam. When the core layer is $GeO_2$-doped $SiO_2$, $CaF_2$ can be used as the plasma gas.

Referring again to FIG. 3, an upper cladding layer 48 is formed next as shown at 34 leaving the core surrounded by cladding material as shown in FIG. 4F. The upper cladding layer can be applied using the same apparatus and method discussed above with respect to the deposition of the lower cladding layer. A perspective view of the cylindrical work piece after the deposition of the upper cladding layer is shown in FIG. 7 at 70.

Next, the optical input and output ports are constructed by cutting the substrate and polishing the edges as shown at 35 and 36 in FIG. 3. For the cylindrical work piece 70 to operate as the optical apparatus 20 shown in FIG. 2, the end faces on which light is incident and from which light is emitted must be smooth. To this end, cylindrical work piece 70 is cut near its ends at locations 210 and 220, and the upper end portion 222 and lower end portion 212 are removed. The end faces produced by this cutting are then polished smooth, preferably to a mirror finish to minimize scattering at the optical ports. To minimize reflection at the end faces, antireflective coatings may be applied to the end faces.

Figure 8:
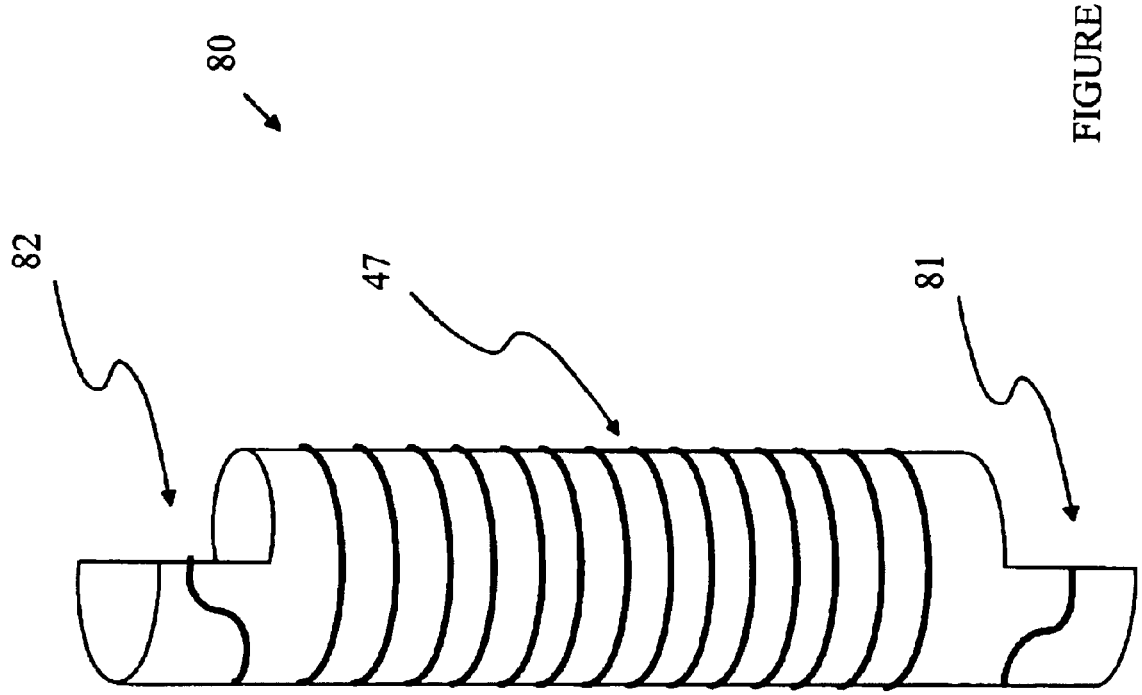
FIG. 8 is a perspective view of a cylindrical work piece 80 in which light is coupled to the optoelectronic apparatus in a direction perpendicular to the axis of the cylindrical work piece.

If the end faces where light is coupled to and from the device are to be made in the circumferential direction, then cut end faces 81 and 82 should be provided parallel to the columnar axis as shown in FIG. 8. FIG. 8 is a perspective view of a cylindrical work piece 80 in which light is coupled to the optoelectronic apparatus in a direction perpendicular to the axis of the cylindrical work piece.

Any of the various materials currently used in the manufacture of optical waveguides can be utilized as the materials to be used in the above manufacturing steps. To give an example, the support substrate, cladding layer, and core layer may be made from a material whose main component is $SiO_2$, and the core layer can be doped with boron, germanium, or the like to raise the refractive index.

Embodiments in which an organic polyimide for the cladding and core layers may also be constructed. If a suitably photosensitive polyimide is used for the core layer, step 33 can be omitted.

Embodiments in which a monocrystalline semiconductor substrate is used for the support substrate can also be practiced. In such embodiments, a semiconductor material can be grown for the cladding and core layers.

Embodiments in which both the cladding layer and core are constructed from a single layer of $GeO_2$-doped $SiO_2$ can also be practiced. In such embodiments, the core is created by irradiating a portion of the layer with intense UV light in a manner analogous to that used in the manufacture of fiber gratings. Such irradiation increases the refractive index of the material through chemical changes to the $GeO_2$. Hence, the separate deposition of a core layer can be avoided. If the writing apparatus discussed above performs the irradiation, the photoresist-based patterning can also be eliminated.

While the above-described embodiments of the present invention have been directed to a compact waveguide, the present invention can be used to form a number of optical components such as semiconductor lasers, photodetectors, light modulators, and other such optical devices, as well as electronic devices. Also, any type of element currently provided on flat substrates, such as optical elements, photocouplers, interferometers, attenuators, lenses, and filters, can be formed on the curved cylindrical surface. In addition, a fiber amplifier can be formed by adding erbium (Er) or another rare earth element to the core layer. Fiber grating can also be formed by creating a periodic refractive index distribution in the propagation direction of the core layer.

Figure 9:
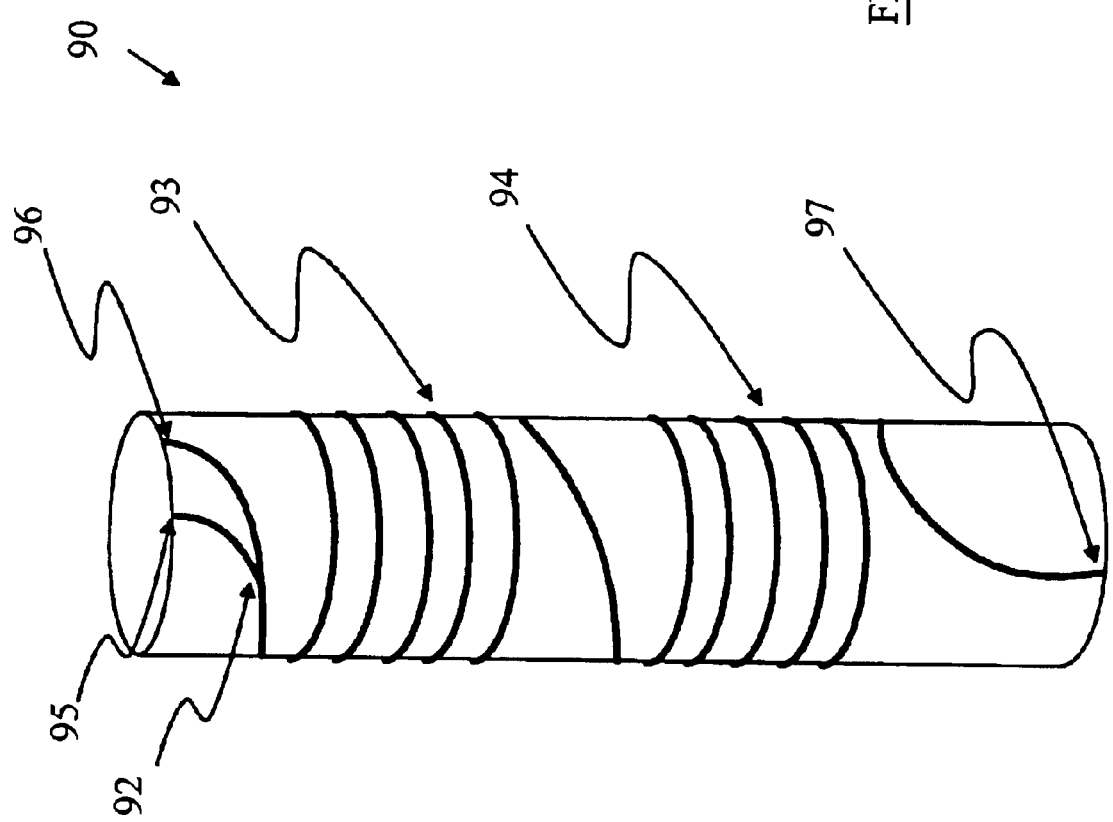
FIG. 9 illustrates one embodiment of a fiber amplifier 90 according to the present invention.

The manner in which the present invention can be utilized to construct other optical devices can be more easily understood with reference to a few exemplary devices. Refer now to FIG. 9, which illustrates one embodiment of a fiber amplifier 90 according to the present invention. Fiber amplifier 90 utilizes an optical waveguide that is wound a plurality of times around a cylindrical substrate in a manner analogous to that described above. An amplified optical signal and an excitation light signal are input via optical signal input terminal 95 and an excitation light signal input terminal 96, respectively. The input terminals are provided at the top end of the fiber amplifier 90. A coupler 92 that is included in the waveguide combines the light signals. The combined signal proceeds through an erbium-doped optical waveguide 93 that functions as an erbium-doped fiber, where the optical signal is amplified. The amplified optical signal and the excitation light enter an optical waveguide 94 that functions as a fiber grating for gain flattening. The amplified optical signal exits via an optical signal output terminal 97 provided to the lower end of the fiber amplifier 90.

Fiber amplifier 90 is constructed in a manner analogous to that described above. Erbium or another rare earth element is added to the core layer in the erbium-doped optical waveguide 93 portion prior to the deposition of the top cladding layer. In addition, the core in portion 94 of the optical waveguide 94 portion is provided with a refractive index that changes periodically in the propagation direction in a manner similar to that used to generate fiber Bragg reflectors in conventional optical fibers. Fiber amplifier 90 can be constructed by doping the core with erbium in an amount about 100 ppm. The length of the core in region 93 can be tens of meters. Fiber grating 94 preferably has a refractive index modulation period of 0.5 $\mu$m and a length of 10 mm. However, these parameters can be varied depending on the particular application.

Figure 10B:
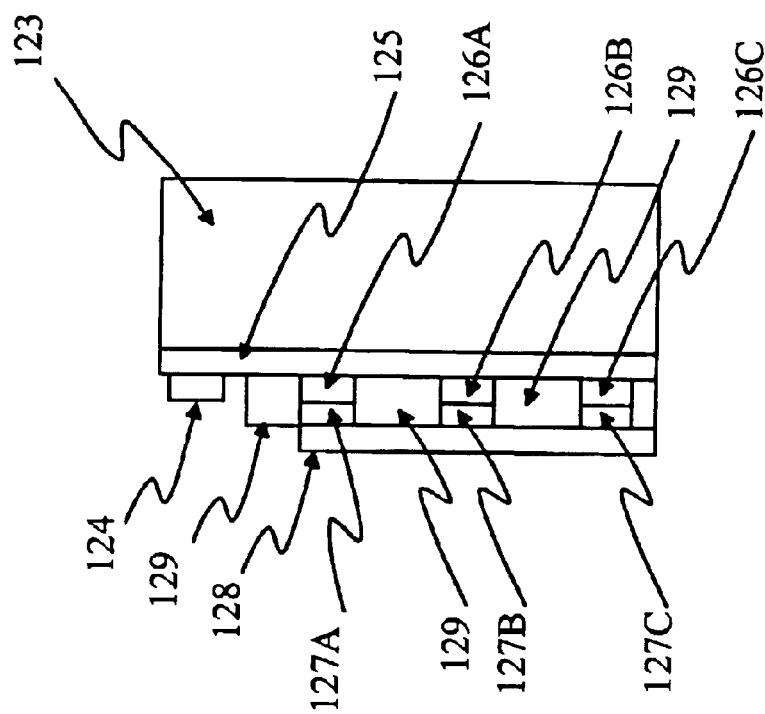
FIG. 10B is a cross section of the side of semiconductor laser 100 in region 120.
Figure 10A:
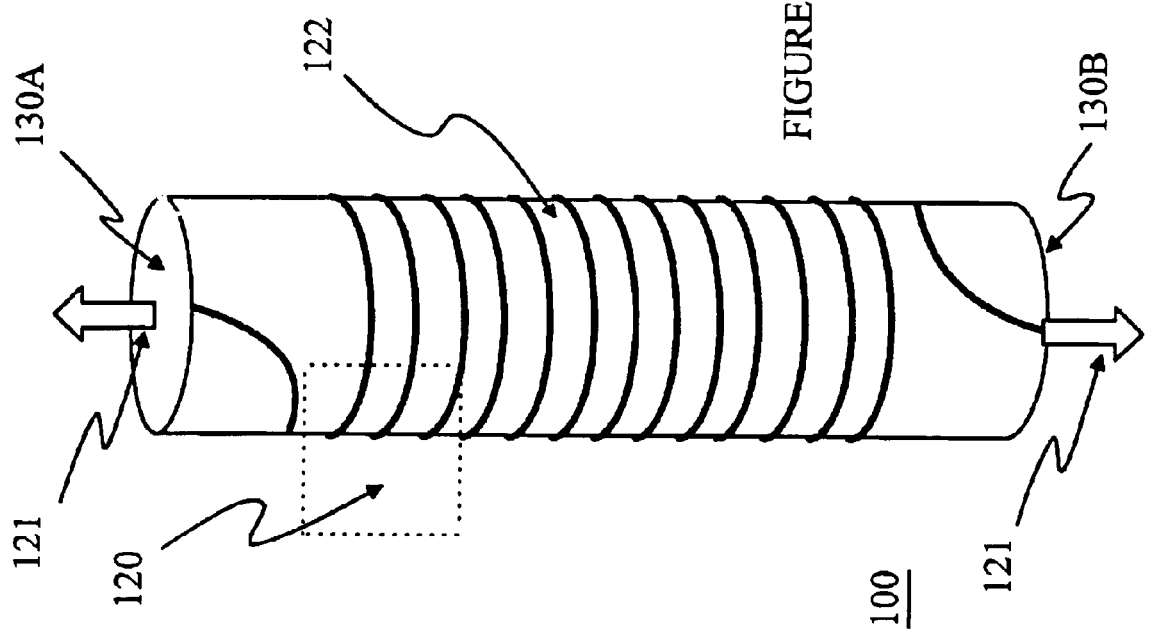
FIG. 10A is an oblique view of semiconductor laser 100.

Refer now to FIGS. 10A and B, which illustrate a semiconductor laser 100 according to the present invention. FIG. 10A is an oblique view of semiconductor laser 100, and FIG. 10B is a cross section of the side thereof in region 120. Semiconductor laser 100 includes an n-type cladding layer 125 formed on the sides of a monocrystalline semiconductor support member 123, over which a laser resonator is disposed in a spiral along an optical waveguide 122. Current is supplied from an n-type electrode 124 to n-type cladding layer 125. Active layers such as 126A, 126B, 126C extend in a pattern on the n-type cladding layer 125 over which corresponding p-type cladding layers 127A, 127B, 127C are formed. A p-type electrode 128 is formed as a common electrode over the p-type cladding layers. An adjacent optical waveguide insulating layer 129 is also provided.

In one example, the monocrystalline semiconductor support member 123 and the cladding layer are both made from InP, the active layers are InGaAsP, and the monocrystalline semiconductor support member is doped to be n-type. As for the electrode materials, AuGeNi is used for the n-type members and AuZn for the p-type members. The output light is taken from surfaces 130A and 130B that are perpendicular to the direction of the columnar axis of the support member as indicated by the arrows shown at 121. Because these surfaces function as mirrors for the resonator, laser performance will be enhanced by mirror polishing and further by forming a highly reflective mirror film. It should be noted that the p-type electrode 128 has been omitted from FIG. 10A to simplify the drawing.

While FIGS. 10A and 10B describe a particular semiconductor laser, it should be noted that other conventional semiconductor laser structures can be advantageously formed on the sides of this cylinder.

The present invention provides a laser structure with an extremely long resonator. Hence, higher laser power output can be obtained. In addition, by making the vertical mode gap extremely narrow, mode lock lasers and other such applications can be implemented.

Figure 11:
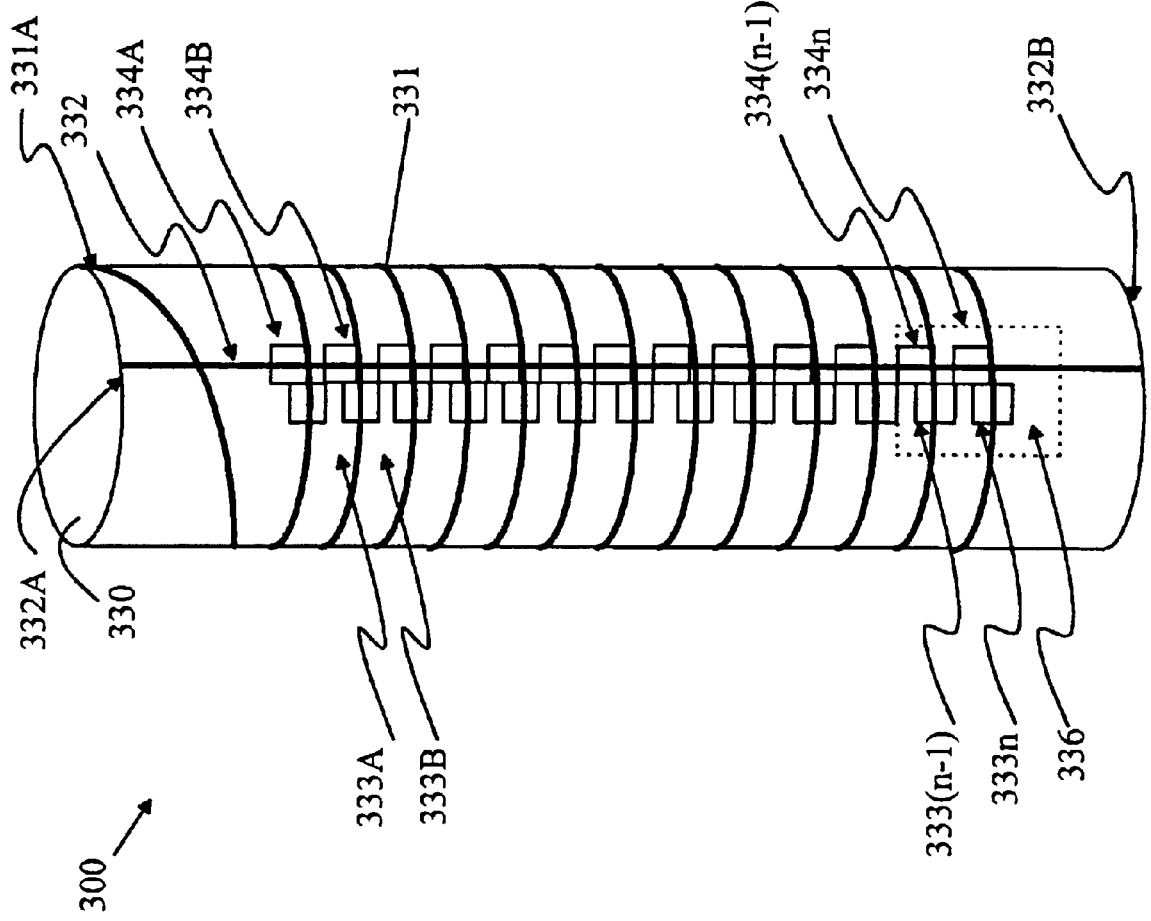
Figure 13:
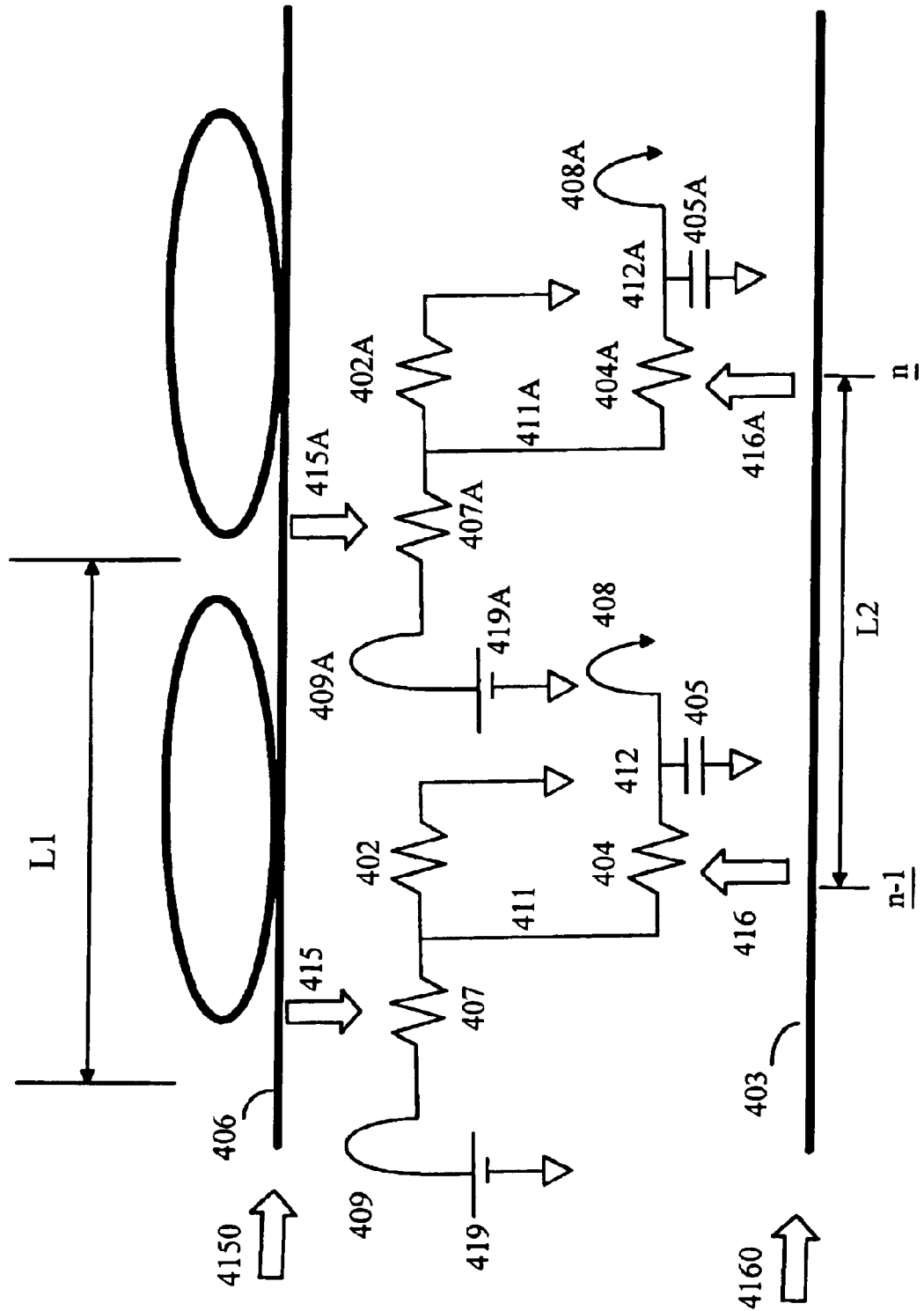
Figure 14:
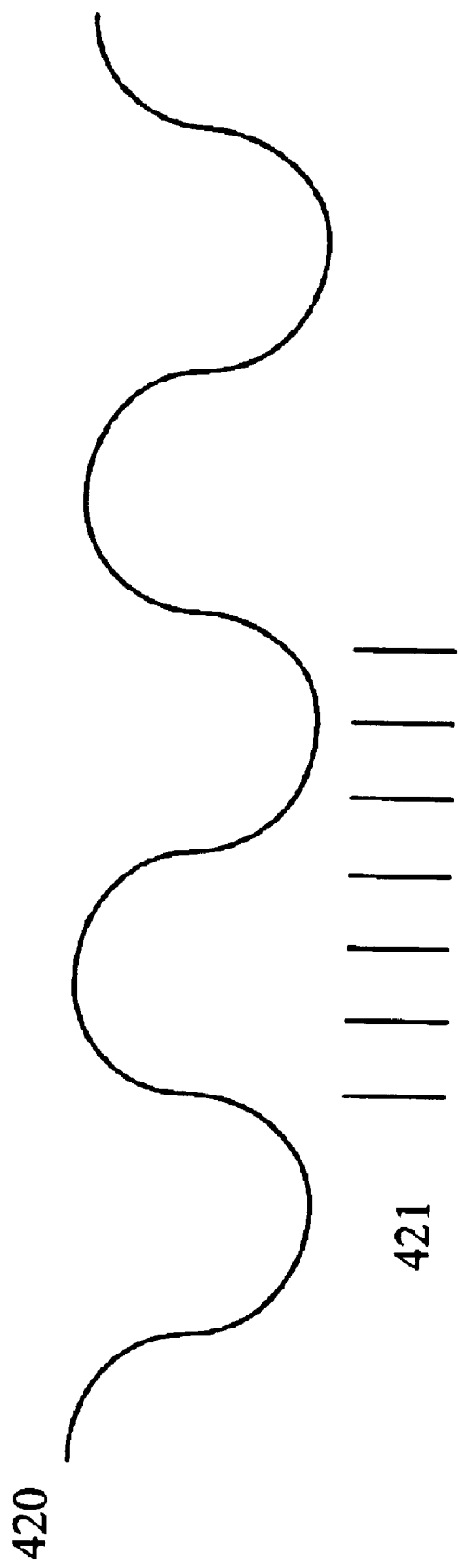

Refer now to FIGS. 11, 12A–12D, 13 and 14, which illustrate the manner in which a sampling apparatus 300 is constructed according to the present invention. Sampling apparatus 300 produces an electrical signal corresponding to the intensities of an optical signal at times specified by a sampling light signal. Sampling apparatus 300 includes a photodetector array, a sampling switch element array, a signal light waveguide, and a sampling light waveguide, integrated on the sides of a cylinder. To simplify the drawing, only the substrate and the optical waveguides are shown in FIG. 11. In practice, an electrical circuit pattern is disposed over these. FIGS. 12A–12D are detail enlargements of the area 336 shown in FIG. 11. FIG. 13 is an optoelectric equivalent circuit diagram. FIG. 14 illustrates the relationship between sampling light and the signal light that is sampled by the apparatus.

Referring to FIG. 11, a first optical waveguide 331 begins at a light input terminal 331A at the top of a cylindrical substrate 330, is disposed in a spiral around the sides of cylindrical substrate 330, and ends in a manner that does not generate reflections. Waveguide 331 receives the light signal that is to be sampled. A second optical waveguide 332 runs down the side of the substrate beginning at a light input terminal 332A at the top of the cylindrical substrate 330. Waveguide 332 travels in a straight line down the side of the cylindrical substrate 330 parallel to the columnar axis, and ends at a light output terminal 332B at the bottom of cylindrical substrate 330. Waveguide 332 receives the light signal that specifies the times at which the signal that is to be measured will be sampled. The first and second optical waveguides 331 and 332 correspond to waveguide 406 used for the optical signal that is to be sampled, and a waveguide 403 used for sampling light, respectively, in FIG. 12.

The first and second optical waveguides 331 and 332 intersect on the side of the cylindrical substrate 330. Each intersection includes a detection circuit and a sampling circuit. Exemplary signal detection circuits are shown at 333A, 333B, . . . , 333n. Exemplary sampling circuits are shown at 334A, 334B, . . . , 334n. These circuits are disposed at every intersection and are integrated in the vicinity of these intersections. Each detection circuit converts the light signal to be measured to an electrical signal that is sampled by the optical switch associated with that detection circuit. The result is then sent as an electrical signal to an external circuit.

In this example, the diameter of the cylindrical substrate 330 is 1 cm, and the distance between the intersections is 100 $\mu$m along the second optical waveguide. The effective index of refraction of the optical waveguides is assumed to be 3.7. Referring to FIG. 13, it takes approximately 400 ps for the light signal that is to be sampled to go around the first optical waveguide 331 once (length L1). The sampling light signal requires approximately 1.3 ps to move between adjacent intersections (L2). Hence, the sampling switches close at approximately the same time. FIG. 14 illustrates the relationship between a waveform 420, which is an example of a light to be measured, and the sampling time 421 of the sampling light pulse.

Refer now to FIGS. 12A–12D. FIG. 12A is a planar view of the area 336 shown in FIG. 11. FIG. 12B is a cross-section through line A–A' which passes through detection circuit 333(n-1). FIG. 12C is a cross-section through line B–B' which passes through the optical switch portion of the sampling circuit 334(n-1). FIG. 12D is a cross-sectional view through line C–C' along a plane that is perpendicular to the columnar axis illustrating the photodetector portion of the measurement signal detection circuit 333(n-1).

A sampling light waveguide layer 414 is formed over a cylindrical substrate member 417 composed of monocrystalline InP. Substrate member 417 is a portion of cylindrical substrate 330 shown in FIG. 11. The waveguide layer 414 includes a cladding layer 4140 and a waveguide core 403, which are made from InGaAsP and InP, respectively. A measurement light detection element 407 for detecting the signal light to be measured and an optical switch element 412 for sampling are formed from light-absorbent InGaAsP at the upper part of the cladding layer 4140. A measurement signal light waveguide layer 413 is formed over the cladding layer so as to include a cladding layer 4130 and a waveguide core 406. The cladding layer 4130 and core 406 are both formed from a material whose main component is $SiO_2$.

Optical switch element 404 and signal light detection element 407 are waveguide-type detectors. The cladding layer in the vicinity of the optical waveguide is thinner than the cladding layers discussed above so that the core of the optical waveguide will leak in the vicinity of the detector. The light to be detected is that which leaks from the core layer to the detector.

A photoconductive switch is basically a semiconductor material that absorbs light and alters its resistance as a result of that absorption. This semiconductor material is sandwiched between two metal electrodes in the direction perpendicular to the input direction of light incident on the photoconductive switch. The optical switch element 404 either transmits or blocks off electrical signals depending on the state of illumination of the semiconductor material. Meanwhile, the signal light detection element 407 detects the signal light to be measured, and controls the conductivity of an electrical waveguide to generate an electrical signal corresponding to the intensity of the signal to be measured so as to produce this electrical signal.

An electrical signal layer 418 is formed over the cladding layer 4130 of the measurement signal light waveguide layer 413. The electrical signal layer 418 consists of a resistor element, an interconnected pattern, or the like, for generating a sampling output electrical signal between an output pattern 412 and a metal ground pattern 401B. The output electrical signal is generated by inputting the parts of the light signal to be measured indicated by the arrows 415 and 416 and arrow 4150 in FIG. 13 and the sampling light 4160 from the first and second optical waveguides 331 and 332. A bias voltage is simultaneously applied between a bias pattern 410 and a metal ground pattern 401A.

One of the electrodes of the measurement signal light detection element 407 is equipped with a bias pattern 410 connected to an outgoing line 409 for applying an external DC bias, and the other electrode is connected to a branched metal pattern 411. The branched metal pattern is connected on one side to metal ground pattern 401A via a terminal resistor 402, and on the other side to one of the electrodes of optical switch element 404. The other electrode of the optical switch element 404 is connected to output pattern 412, and an outgoing line 408 for taking a sampling output electrical signal to an external circuit that is connected to this output pattern 412. The other electrode is also connected via a capacitor 405 to the metal ground pattern 401B linked separately to metal ground pattern 401A.

The details of a method for sampling an optical signal by means of light using two photodetectors are given in the specification of Japanese Patent Application 2001-223455 by the present applicant, which is hereby incorporated by reference. Since numerous samples can be acquired at substantially the same time by using numerous sampling circuits, it is easy to convert these samples to digital values and display them, either directly or as an average, along with information on the time axis. Connecting numerous sampling circuits increases the amount of information that can be displayed in an instant, and makes high-speed or high-precision measurement possible.

The embodiment of the sampling circuit discussed above samples the optical signal once every time the signal makes a loop of the first waveguide. However, sampling may also be performed at other intervals. For example, a sample can be measured when the signal has traversed multiple loops.

Various modifications to the present invention will become apparent to those skilled in the art from the foregoing description and accompanying drawings. Accordingly, the present invention is to be limited solely by the scope of the following claims.

What is claimed is:

1. A method for manufacturing an optical device comprising:

providing a substrate having a surface thereon;

rotating said substrate relative to a film depositing apparatus while depositing an optically transparent medium having a first index of refraction on said surface; and generating a core region having a second index of refraction in said transparent medium, said core region defining the location of an optical waveguide.

2. The method of claim 1 wherein said substrate comprises a cylinder having a cylindrical axis and wherein said rotation is about said cylindrical axis.

3. The method of claim 2 further comprising cutting said substrate in a plane perpendicular to said axis, said plane passing through said waveguide.

4. The method of claim 1 further comprising generating an element of an optical circuit including patterning said optically transparent medium.

5. The method of claim 1 further comprising depositing a second layer of a transparent medium having said first index of refraction over said core region.

6. A method for manufacturing an optical device comprising:

providing a substrate having a surface thereon;

rotating said substrate relative to a film depositing apparatus while depositing an optically transparent medium having a first index of refraction on said surface;

generating a core region having a second index of refraction in said transparent medium, said core region defining the location of an optical waveguide, wherein said substrate comprises a cylinder having a cylindrical axis and wherein said rotation is about said cylindrical axis; and wherein said core region winds around said substrate in a spiral.

\* \* \* \* \*